(12) United States Patent
Kang et al.

(10) Patent No.: US 10,817,222 B2
(45) Date of Patent: Oct. 27, 2020

(54) NONVOLATILE MEMORY APPARATUS, SEMICONDUCTOR SYSTEM INCLUDING THE NONVOLATILE MEMORY APPARATUS, AND OPERATING METHOD OF THE NONVOLATILE MEMORY APPARATUS

(71) Applicant: SK hynix Inc., Icheon-si, Gyeonggi-do (KR)

(72) Inventors: Seok Joon Kang, Seoul (KR); Jin Su Park, Icheon-si (KR); Ho Seok Em, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/289,907

(22) Filed: Mar. 1, 2019

(65) Prior Publication Data
US 2019/0391759 A1    Dec. 26, 2019

(30) Foreign Application Priority Data

Jun. 26, 2018 (KR) .................. 10-2018-0073160

(51) Int. Cl.
*G06F 11/07* (2006.01)
*G06F 3/06* (2006.01)
*G11C 13/00* (2006.01)

(52) U.S. Cl.
CPC .......... *G06F 3/0659* (2013.01); *G06F 3/0604* (2013.01); *G06F 3/0679* (2013.01); *G11C 13/0004* (2013.01); *G11C 13/004* (2013.01); *G11C 13/0069* (2013.01)

(58) Field of Classification Search
CPC ..... G11C 13/0035; G11C 7/14; G11C 29/883; G11C 16/10
See application file for complete search history.

(56) References Cited

U.S. PATENT DOCUMENTS

| 8,649,212 | B2 | 2/2014 | Kau et al. | |
| 9,824,767 | B1* | 11/2017 | Mantegazza | G11C 16/10 |
| 2011/0047319 | A1* | 2/2011 | Jeon | G06F 13/4243 |
| | | | | 711/103 |
| 2011/0122684 | A1* | 5/2011 | Sheu | G11C 7/14 |
| | | | | 365/163 |
| 2015/0363257 | A1* | 12/2015 | Kwon | G11C 13/0035 |
| | | | | 714/6.11 |
| 2017/0315891 | A1* | 11/2017 | Park | G11C 29/883 |

FOREIGN PATENT DOCUMENTS

KR   1020170139187 A   12/2017

* cited by examiner

*Primary Examiner* — Ryan Bertram
*Assistant Examiner* — Trang K Ta
(74) *Attorney, Agent, or Firm* — William Park & Associates Ltd.

(57) ABSTRACT

A semiconductor system may include a memory controller and a non-volatile memory apparatus. The memory controller may generate a recovery command signal by measuring a power off time of the non-volatile memory apparatus. The non-volatile memory apparatus may perform a drift recovery operation based on the recovery command signal.

25 Claims, 7 Drawing Sheets

NONVOLATILE MEMORY APPARATUS, SEMICONDUCTOR SYSTEM INCLUDING THE NONVOLATILE MEMORY APPARATUS, AND OPERATING METHOD OF THE NONVOLATILE MEMORY APPARATUS

CROSS-REFERENCES TO RELATED APPLICATION

The present application claims priority under 35 U.S.C. § 119(a) to Korean application number 10-2018-0073160, filed on Jun. 26, 2018, in the Korean Intellectual Property Office, which is incorporated herein by reference in its entirety.

BACKGROUND

1. Technical Field

Various embodiments of the present disclosure relate to a semiconductor technology and, more particularly, to a non-volatile memory apparatus and a semiconductor system including the same.

2. Related Art

An electronic device includes a lot of electronic elements, and a computer system includes lots of semiconductor apparatuses each comprising a semiconductor. The computer system may include a memory apparatus. A dynamic random access memory (DRAM) is widely used as a general memory apparatus because of advantage that it stores and outputs data at a fast and steady speed and is of random access. However, the DRAM is volatile, losing stored data when it is powered off since it has a memory cell comprising a capacitor. A flash memory apparatus is disclosed for overcoming this disadvantage. The flash memory apparatus is non-volatile, keeping stored data even when it is powered off since it has a memory cell comprising a floating gate. However, compared to the DRAM, the flash memory apparatus has the disadvantage of storing and outputting data at a slower speed and is not of random access.

Recently disclosed are next-generation memory apparatuses such as a phase change RAM, a magnetic RAM, a resistive RAM and a ferroelectric RAM that have advantages of fast operational speed and non-volatile characteristics. Particularly, the PRAM has a phase change memory cell comprising a chalcogenide and is capable of storing data by changing a resistive value of the memory cell.

SUMMARY

In an embodiment of the present disclosure, a semiconductor system may include a non-volatile memory apparatus and a memory controller. The non-volatile memory apparatus may be configured to perform a drift recovery operation based on a recovery command signal. The memory controller may be configured to measure a power off time of the non-volatile memory apparatus and generate the recovery command signal based on the power off time.

In an embodiment of the present disclosure, a semiconductor system may include a non-volatile memory apparatus and a memory controller. The non-volatile memory apparatus may be configured to perform a drift recovery operation based on a recovery command signal. The memory controller may be configured to calculate a threshold voltage change based on a power off time of the non-volatile memory apparatus and temperature change of the semiconductor system, and generate the recovery command signal based on the threshold voltage change.

In an embodiment of the present disclosure, a method of operating a semiconductor system may include measuring, by a memory controller, a power off time of a non-volatile memory apparatus when the non-volatile memory apparatus is powered down. The method may include calculating, by the memory controller, a threshold voltage change based on the power off time. The method may include determining, by the memory controller, whether a drift recovery is required, based on the threshold voltage change. And the method may include transmitting, by the memory controller, a recovery command signal and a normal command signal based on a result of the determining when the non-volatile memory apparatus is powered up.

DETAILED DESCRIPTION

Hereinafter, a semiconductor apparatus according to the present disclosure will be described below with reference to the accompanying drawings through embodiments.

Figure 1:
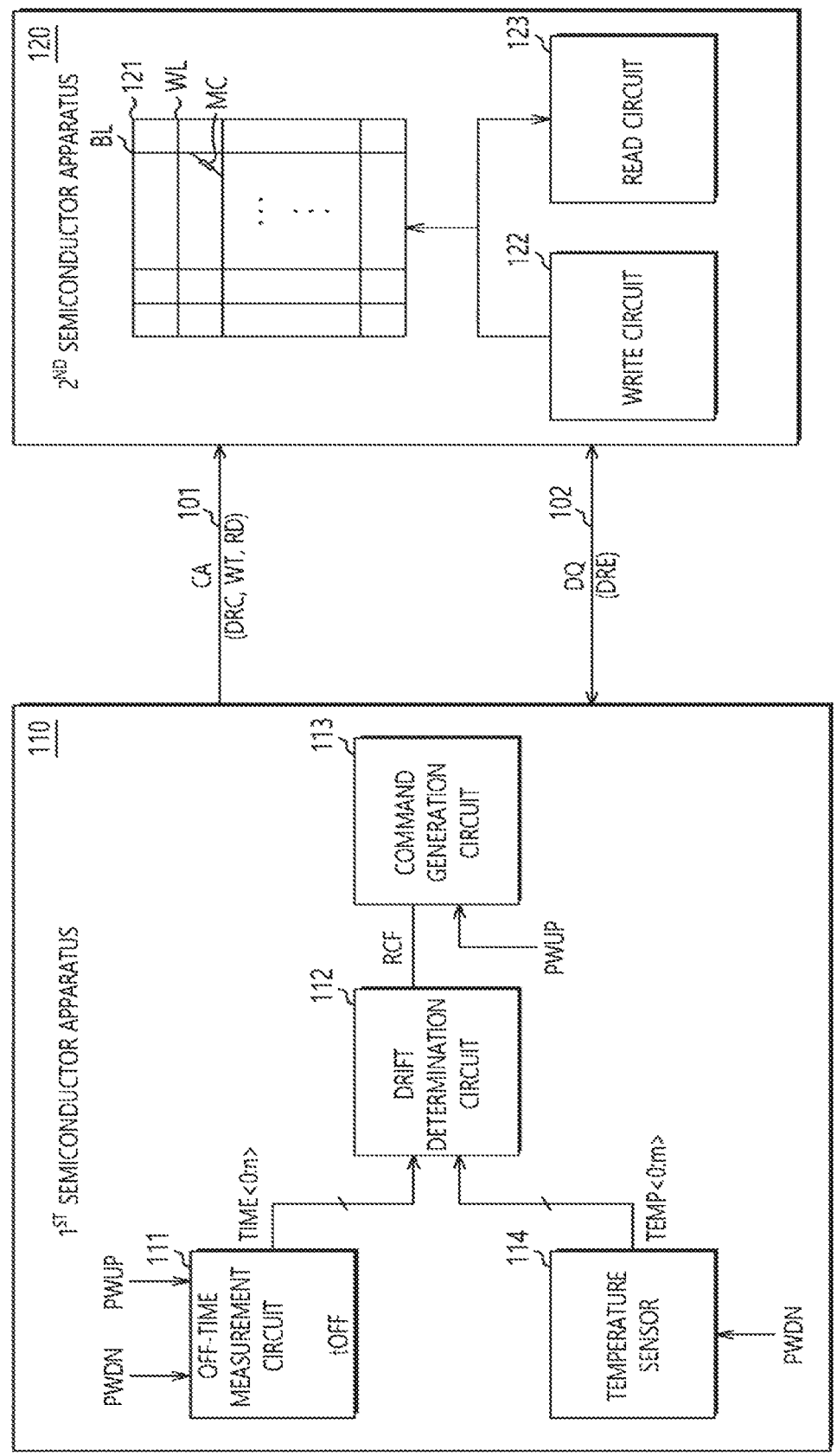
FIG. 1 is a diagram illustrating a configuration of a semiconductor system in accordance with an embodiment of the present disclosure.

FIG. 1 is a diagram illustrating a configuration of a semiconductor system 1 in accordance with an embodiment of the present disclosure. Referring to FIG. 1, the semiconductor system 1 may include a first semiconductor apparatus 110 and a second semiconductor apparatus 120. The first semiconductor apparatus 110 may provide various control signals required for the second semiconductor apparatus 120 to operate. The first semiconductor apparatus 110 may include apparatuses of various types. For example, the first semiconductor apparatus 110 may be a host apparatus such as a central processing unit (CPU), a graphic processing unit (GPU), a multi-media processor (MMP), a digital signal processor, an application processor (AP) and a memory controller. The second semiconductor apparatus 120 may be a memory apparatus. The second semiconductor apparatus 120 may include a non-volatile memory apparatus. The non-volatile memory apparatus may include a read only memory (ROM), a programmable ROM (PROM), an electrically erasable and programmable ROM (EEPROM), an electrically programmable ROM (EPROM), a flash memory, a phase change memory (PCM), a magnetic RAM (MRAM), a resistive RAM (RRAM), a ferroelectric RAM (FRAM) and so forth. In an embodiment, the second semiconductor apparatus 120 may be a PRAM having memory cells each comprising a phase change substance.

The second semiconductor apparatus 120 may be coupled to the first semiconductor apparatus 110 through a plurality of buses. The plurality of buses may be signal transmission paths, links or channels for signal transmission. The plurality of buses may include a command bus, an address bus, a clock bus, the data bus and so forth. The command bus, the address bus and the clock bus may be one-way buses and the data bus may be a two-way bus. FIG. 1 exemplarily illustrates only a command bus 101 and a data bus 102 coupled between the first semiconductor apparatus 110 and the second semiconductor apparatus 120. The second semiconductor apparatus 120 may receive a command signal CMD provided from the first semiconductor apparatus 110 through the command bus 101. The second semiconductor apparatus 120 may be coupled to the first semiconductor apparatus 110 through the data bus 102, may receive data DQ provided from the first semiconductor apparatus 110 and may transmit data DQ to the first semiconductor apparatus 110.

In an embodiment, the command signal CMD provided from the first semiconductor apparatus 110 to the second semiconductor apparatus 120 through the command bus 101 may include at least a recovery command signal DRC and a normal command signal. The recovery command signal DRC may direct the second semiconductor apparatus 120 to perform a drift recovery operation to compensate for the resistance drift. The normal command signal may direct the second semiconductor apparatus 120 to perform a normal operation. The normal operation may include a read operation and a write operation. The normal command signal may include a write command signal WT directing the second semiconductor apparatus 120 to perform a write operation and a read command signal RD directing the second semiconductor apparatus 120 to perform a read operation. In response to the recovery command signal DRC, the second semiconductor apparatus 120 may perform a drift recovery operation and may provide the first semiconductor apparatus 110 with a recovery completion signal DRE through the data bus 102 when the drift recovery operation is completed.

Referring to FIG. 1, the second semiconductor apparatus 120 may include a memory cell array 121, a write circuit 122 and a read circuit 123. The memory cell array 121 may include a plurality of word lines WL disposed in a row direction and a plurality of bit lines BL disposed in a column direction. The memory cell array 121 may include a plurality of memory cells MC respectively coupled to cross points formed by the plurality of word lines WL and the plurality of bit lines BL. Each of the plurality of memory cells MC may be a phase change memory cell comprising a phase change substance. The memory cells MC may store data by changing resistive values thereof. For example, the memory cells MC may change to a low resistance state or a high resistance state, storing different data according to the resistance state. For example, the memory cells MC may be set cells to store set data in the low resistance state. The memory cells MC may be reset cells to store reset data in the high resistance state. In an embodiment, the memory cells MC may be one of three or more resistance states and may store data of multiple bits according to the three or more resistance states.

The write circuit 122 and the read circuit 123 may be commonly coupled to the data bus 102. The write circuit 122 may receive data DQ provided from the first semiconductor apparatus 110 through the data bus 102. The write circuit 122 may store the data DQ into the memory cell array 121 by applying a voltage or a current corresponding to the data DQ to the memory cells MC. The write circuit 122 may perform a set write operation for the memory cells MC to be in a low resistance state, and/or the set state, and may perform a reset write operation for the memory cells MC to be in a high resistance state, and/or the reset state.

The read circuit 123 may sense data store in the memory cell array 121. For example, the read circuit 123 may output data DQ by detecting the resistance states of the memory cells MC according to a read voltage. The read circuit 123 may output set data as the data DQ when the memory cells MC are in a low resistance state, and/or the set state, and may output reset data as the data DQ when the memory cells MC are in a high resistance state, and/or the reset state. The data DQ may be provided to the first semiconductor apparatus 110 through the data bus 102.

Figure 2:
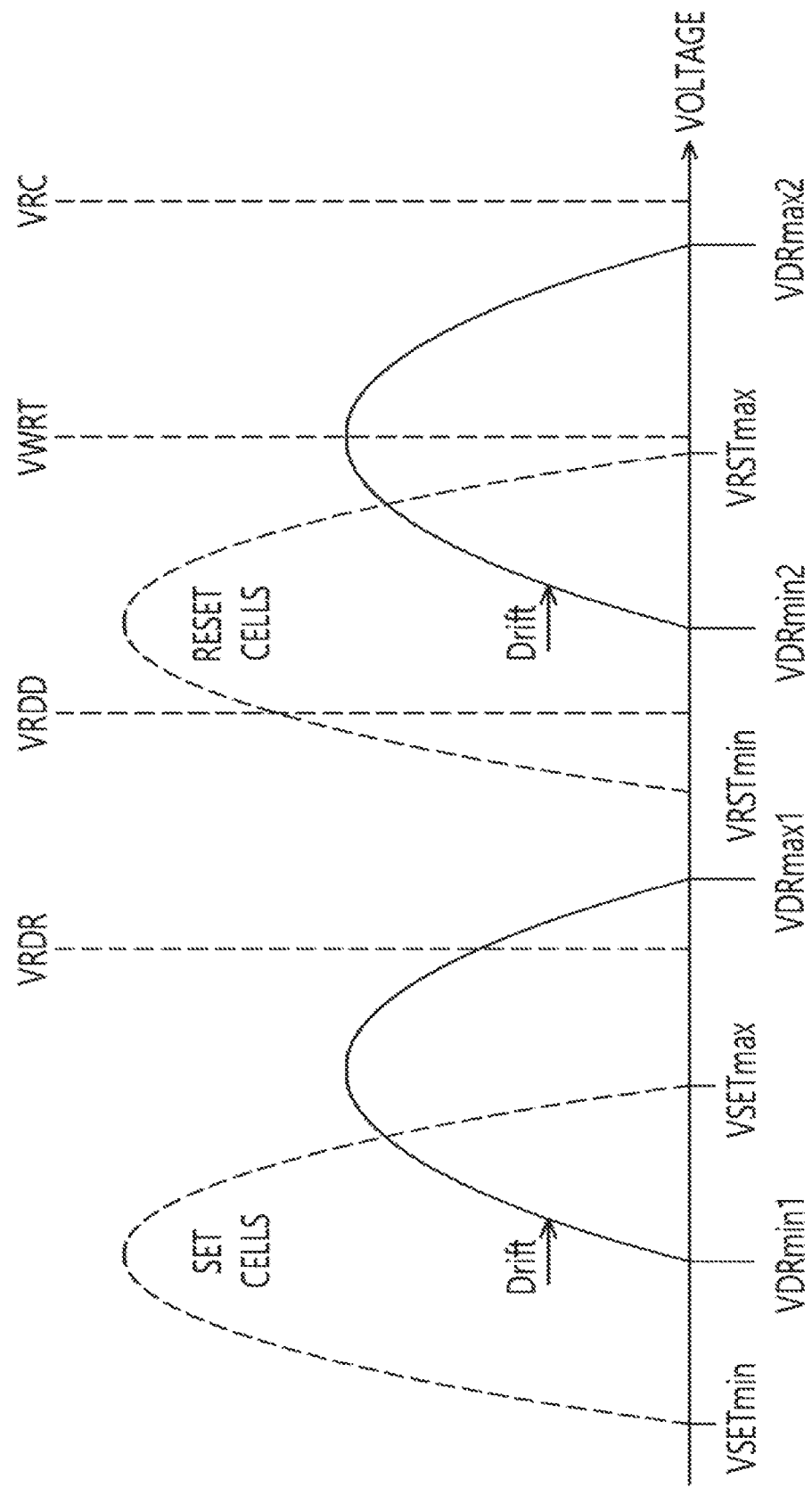
FIG. 2 is a diagram illustrating a threshold voltage of a memory cell according to resistive distribution of the memory cell.

The memory cells MC may comprise phase change material, and, therefore, a resistance drift may occur, according to changes in time or temperature. The resistance drift may represent an increase in the resistances of the memory cells MC. FIG. 2 is a diagram illustrating a threshold voltage of a memory cell according to the resistive distribution of the memory cell. Referring to FIG. 2, the x-axis of the graph may represent a voltage. Referring to FIG. 2, memory cells in the low resistance state may be set cells SET CELLS and memory cells in the high resistance state may be reset cells RESET CELLS. The threshold voltages of the set cells SET CELLS may be voltages between a set distribution minimum voltage VSETmin and a set distribution maximum voltage VSETmax. The threshold voltages of the reset cells RESET CELLS may be voltages between a reset distribution minimum voltage VRSTmin and a reset distribution maximum voltage VRSTmax. Referring to FIG. 2, a read reference voltage VRDR may be used to distinguish between the set cells SET CELLS and the reset cells RESET CELLS.

Referring to FIGS. 1 and 2, the read circuit 123 may detect the resistance states of the memory cells MC through the read reference voltage VRDR. The read reference voltage VRDR may have a voltage level between the set distribution maximum voltage VSETmax and the reset distribution minimum voltage VRSTmin and, for example, may have a middle level between the set distribution maximum voltage VSETmax and the reset distribution minimum voltage VRSTmin. A write voltage VWRT may be used to change the resistance states of the memory cells MC. The write circuit 122 may control the memory cells MC to be in the low resistance state or the high resistance state by causing the snap-back of the memory cells MC through the write voltage VWRT and applying program currents to store the set data or the reset data. The write voltage VWRT may have a higher level than the reset distribution maximum voltage VRSTmax to cause the snap-back of both the set cells SET CELLS and the reset cells RESET CELLS. The write voltage VWRT may have a voltage level close to the reset distribution maximum voltage VRSTmax to prevent an over-reset of the memory cells MC.

As time flies without a normal operation, such as a read operation and a write operation, to the memory cells MC, a resistance drift may occur. That is, an increase in the resistances of the memory cells MC may occur. Due to the resistance drift, the resistances and/or threshold voltages of the set cells SET CELLS and the reset cells RESET CELLS may increase in voltage. For example, the threshold voltages of the set cells SET CELLS may change to become ones between a first drift minimum voltage VDRmin1 and a first drift maximum voltage VDRmax1 and the threshold voltages of the reset cells RESET CELLS may change to become ones between a second drift minimum voltage VDRmin2 and a second drift maximum voltage VDRmax2. The first drift maximum voltage VDRmax1 may increase to have a higher level than the read reference voltage VRDR. When a read operation is performed according to the read reference voltage VRDR after the resistance drift occurs, the drifted set cells SET CELLS may be determined to be in the high resistance state and/or to store reset data. Therefore, when the resistance drift occurs, a drift recovery operation may be performed to the drifted set cells SET CELLS and the drifted reset cells RESET CELLS. The drifted set cells SET CELLS and the drifted reset cells RESET CELLS may go back to the original resistance states through the drift recovery operation.

The drift recovery operation may include at least one of a first recovery operation and a second recovery operation. During the first recovery operation, a recovery voltage VRC may be applied across the memory cells MC. The recovery voltage VRC may have a high voltage level enough to cause the snap-back of the memory cells MC in both the low resistance state and the high resistance state. For example, the recovery voltage VRC may have a higher level than the second drift maximum voltage VDRmax2 to cause the snap-back of all the drifted set cells SET CELLS and the drifted reset cells RESET CELLS. The write circuit 122 may perform the first recovery operation by applying the recovery voltage VRC across the memory cells MC.

During the second recovery operation, the resistance states of the memory cells MC may be determined, and data may be rewritten into the memory cells MC according to the determination. The second recovery operation may be a refresh operation. During the second recovery operation, the read circuit 123 may determine the resistance states of the memory cells MC by using a drift read voltage VRDD. The drift read voltage VRDD may be higher than the read reference voltage VRDR. For example, the drift read voltage VRDD may have a level between the first drift maximum voltage VDRmax1 and the second drift minimum voltage VDRmin2. The drift read voltage VRDD may have a middle level between the first drift maximum voltage VDRmax1 and the second drift minimum voltage VDRmin2. Because the read circuit 123 performs a read operation by using the read reference voltage VRDR, the read circuit 123 may precisely determine the previous resistance state of the drifted memory cell. That is, due to the read reference voltage VRDR, the drifted set cells SET CELLS may be determined to be in the low resistance state and the drifted reset cells RESET CELLS may be determined to be in the high resistance state. The write circuit 122 may perform a set write operation to the memory cells MC, which are determined to be set cells SET CELLS, to change the threshold voltages of the memory cells MC into ones between the set distribution minimum voltage VSETmin and the set distribution maximum voltage VSETmax. The write circuit 122 may perform a reset write operation to the memory cells MC, which are determined to be reset cells RESET CELLS, to change the threshold voltages of the memory cells MC into ones between the reset distribution minimum voltage VRSTmin and the reset distribution maximum voltage VRSTmax. In an embodiment, the drift read voltage VRDD may have a voltage level that dynamically changes according to a degree of the resistance drift. For example, as the resistances of the memory cells MC become higher due to the resistance drift, the level of the drift read voltage VRDD may become higher. The level of the drift read voltage VRDD may be determined by the first semiconductor apparatus 110.

Referring to FIG. 1, the first semiconductor apparatus 110 may include an off-time measurement circuit 111, a drift determination circuit 112 and a command generation circuit 113. The off-time measurement circuit 111 may measure a power off time tOFF of the second semiconductor apparatus 120. The power off time tOFF may indicate temporal duration, for which the second semiconductor apparatus 120 is powered-down. When the second semiconductor apparatus 120 enters a power saving mode, the second semiconductor apparatus 120 may be powered-down. The power saving mode may include a power down mode, a sleep mode, a standby mode, a deep power down mode, and so forth. While the second semiconductor apparatus 120 is powered-down, the second semiconductor apparatus 120 might not perform a normal operation such as a read operation and a write operation, and, therefore, a resistance drift may occur. The off-time measurement circuit 111 may receive a power down signal PWDN. The off-time measurement circuit 111 may count the power off time tOFF upon the reception of the power down signal PWDN. The off-time measurement circuit 111 may output time information TIME<0:n> ('n' is an integer equal to or greater than 1) corresponding to the power off time tOFF. The time information TIME<0:n> may be a digital code signal including a plurality of bits. The off-time measurement circuit 111 may further receive a power up signal PWUP. The power up signal PWUP may direct the second semiconductor apparatus 120 to exit the power saving mode. The off-time measurement circuit 111 may initialize the time information TIME<0:n> based on the power up signal PWUP.

The drift determination circuit 112 may calculate a threshold voltage change based on the time information TIME<0:n>. The drift determination circuit 112 may increase the threshold voltage change as the power off time tOFF becomes greater, and the drift determination circuit 112 may enable a recovery flag RCF when the threshold voltage change reaches or surpasses a threshold value. For example, the drift determination circuit 112 may include a table having information of the threshold voltage change corresponding to the time information TIME<0:n> and may enable the recovery flag RCF when the threshold voltage change reaches or surpasses the threshold value according to the table. The values representing the threshold voltage change in the table may be obtained through a test and/or a simulation. The drift determination circuit 112 may receive the recovery completion signal DRE provided from the second semiconductor apparatus 120. Based on the recovery completion signal DRE, the drift determination circuit 112 may initialize the threshold voltage change and initialize and/or disable the recovery flag RCF. The recovery voltage VRC and the drift read voltage VRDD illustrated in FIG. 2 may have levels dynamically changing according to the threshold voltage change. The drift determination circuit 112 may further generate information for determining the levels of the recovery voltage VRC and the drift read voltage VRDD.

The command generation circuit 113 may receive the recovery flag RCF and the power up signal PWUP. When the power up signal PWUP is enabled, the command generation circuit 113 may detect whether the recovery flag RCF is enabled. When the recovery flag RCF is disabled, the command generation circuit 113 may generate the normal command signal and provide the normal command signal to the second semiconductor apparatus 120. The command generation circuit 113 may control the second semiconductor apparatus 120 to perform a write operation and a read operation by providing a write command signal WT and a read command signal RD to the second semiconductor apparatus 120. When the recovery flag RCF is enabled, the command generation circuit 113 might not provide the normal command signal to the second semiconductor apparatus 120. When the recovery flag RCF is enabled, the command generation circuit 113 may generate a recovery command signal DRC and provide the recovery command signal DRC to the second semiconductor apparatus 120.

Referring to FIG. 1, the first semiconductor apparatus 110 may further include a temperature sensor 114. The temperature sensor 114 may generate temperature information TEMP<0:m> ('m' is an integer equal to or greater than 1) by measuring a temperature of the semiconductor system 1. The temperature information TEMP<0:m> may be a digital code signal including a plurality of bits. The temperature sensor 114 may provide the temperature information TEMP<0:m> to the drift determination circuit 112. The temperature sensor 114 may generate the temperature information TEMP<0:m> having a code value varying according to the temperature change of the semiconductor system 1. The drift determination circuit 112 may further receive the temperature information TEMP<0:m>. The drift determination circuit 112 may determine, based on the temperature information TEMP<0:m>, whether the temperature of the semiconductor system 1 is outside a reference range. The reference range may be a predetermined range including room temperature. The drift determination circuit 112 may accelerate the threshold voltage change when the temperature of the semiconductor system 1 is determined to be outside the reference range. As the temperature of the semiconductor system 1 is determined to be further out of the reference range, the drift determination circuit 112 may further accelerate the threshold voltage change. The drift determination circuit 112 may include a table having information of an amount of the temperature change, an elapsed time with the changed temperature, and so forth.

Figure 3:
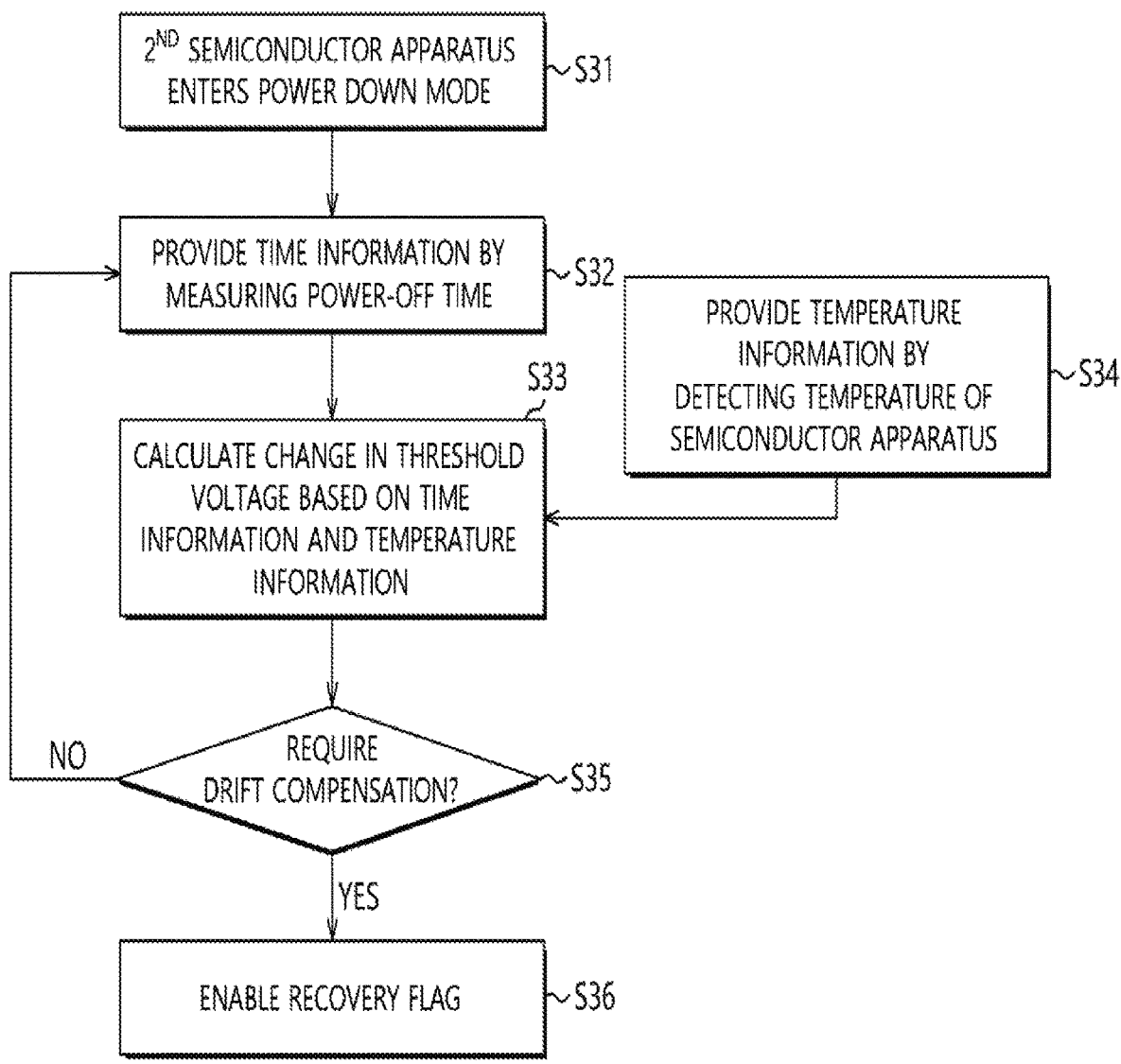
FIGS. 3 and 4 are flowcharts illustrating an operation of the semiconductor system in accordance with an embodiment of the present disclosure.
Figure 4:
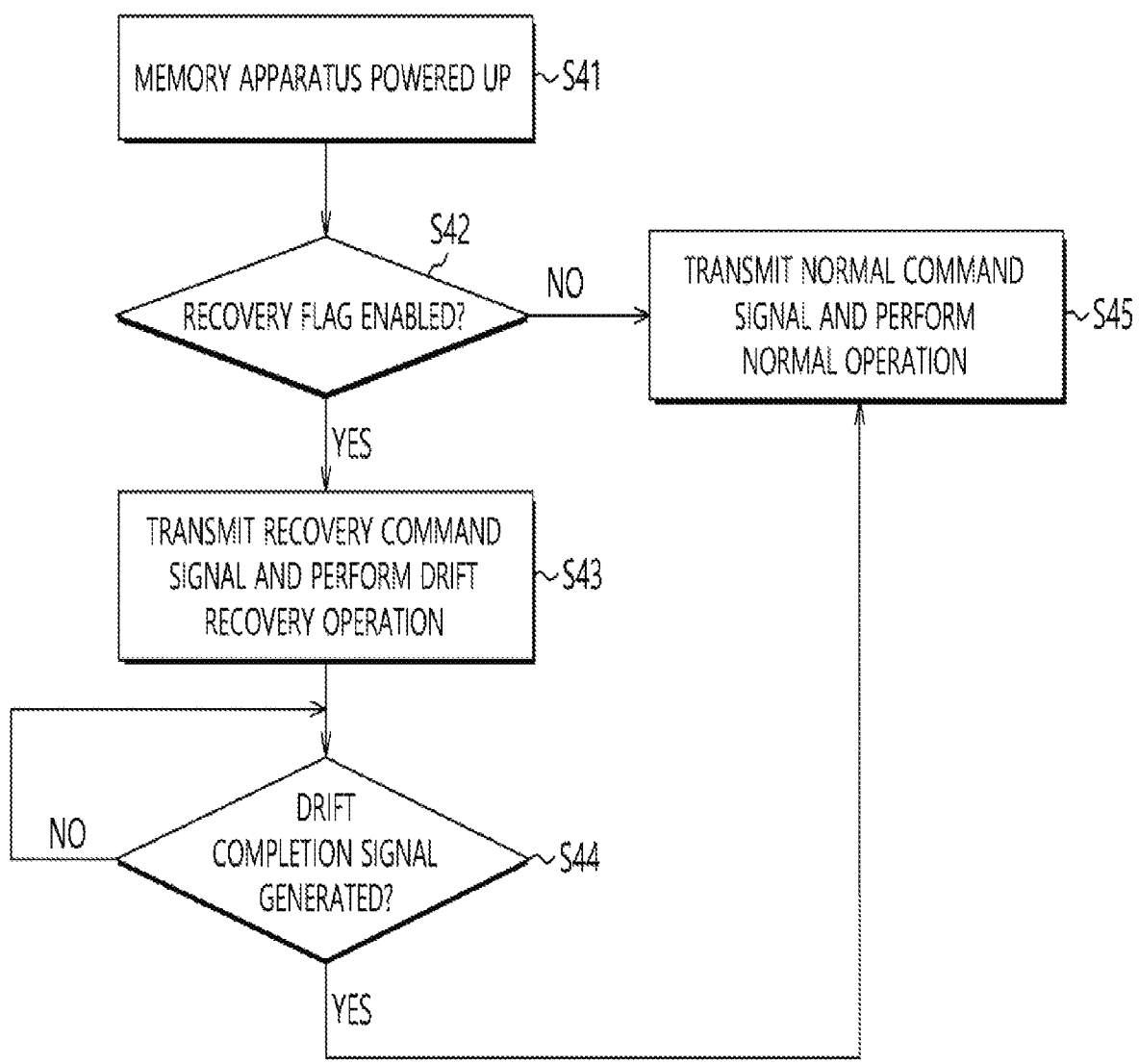

FIGS. 3 and 4 are flowcharts illustrating operations of the semiconductor system 1 in accordance with an embodiment of the present disclosure. Described with reference to FIGS. 1 to 4 will be the operation of the semiconductor system 1 in accordance with an embodiment of the present disclosure. Referring to FIG. 3, when the second semiconductor apparatus 120 enters the power down mode (S31), the off-time measurement circuit 111 of the first semiconductor apparatus 110 may count the power off time tOFF based on the power down signal PWDN. The off-time measurement circuit 111 may provide the drift determination circuit 112 with the time information TIME<0:n> corresponding to the power off time tOFF (S32). The drift determination circuit 112 may calculate the threshold voltage change based on the time information TIME<0:n> (S33). At this time, the temperature sensor 114 may provide the temperature information TEMP<0:m> to the drift determination circuit 112 (S34). The drift determination circuit 112 may calculate the threshold voltage change based on the temperature information TEMP<0:m> as well as the time information TIME<0:n> (S33).

The drift determination circuit 112 may determine, based on the threshold voltage change, whether the drift recovery is required (S35). When the threshold voltage change is a threshold value or less, the drift determination circuit 112 may keep the recovery flag RCF disabled and steps S32 to S25 may be repeated. When the threshold voltage change is greater than the threshold value, the drift determination circuit 112 may enable the recovery flag RCF (S36). Upon reception of the recovery completion signal DRE, the drift determination circuit 112 may initialize and/or disable the recovery flag RCF.

Referring to FIG. 4, when the second semiconductor apparatus 120 gets out of the power down mode and is powered up (S41), the command generation circuit 113 may generate the command signal CMD based on the power up signal PWUP and the recovery flag RCF. The command generation circuit 113 may generate the command signal CMD based on whether the recovery flag RCF is enabled (S42). When the recovery flag RCF is enabled, the command generation circuit 113 might not generate the normal command signal and may generate the recovery command signal DRC and provide the recovery command signal DRC to the second semiconductor apparatus 120. In response to the recovery command signal DRC, the second semiconductor apparatus 120 may perform a drift recovery operation (S43). Upon completion of the drift recovery operation, the second semiconductor apparatus 120 may provide the first semiconductor apparatus 110 with the recovery completion signal DRE, and the first semiconductor apparatus 110 may stand by for the recovery completion signal DRE (S44). When the first semiconductor apparatus 110 receives the recovery completion signal DRE, the first semiconductor apparatus 110 may provide the second semiconductor apparatus 120 with the normal command signal, and the second semiconductor apparatus 120 may perform the normal operation based on the normal command signal (S45). When the second semiconductor apparatus 120 is powered up and the recovery flag RCF is disabled at step S42, the command generation circuit 113 might not generate the recovery command signal DRC. The command generation circuit 113 may generate the normal command signal and may provide the second semiconductor apparatus 120 with the normal command signal. The second semiconductor apparatus 120 may perform the normal operation without the recovery operation (S45).

Figure 5:
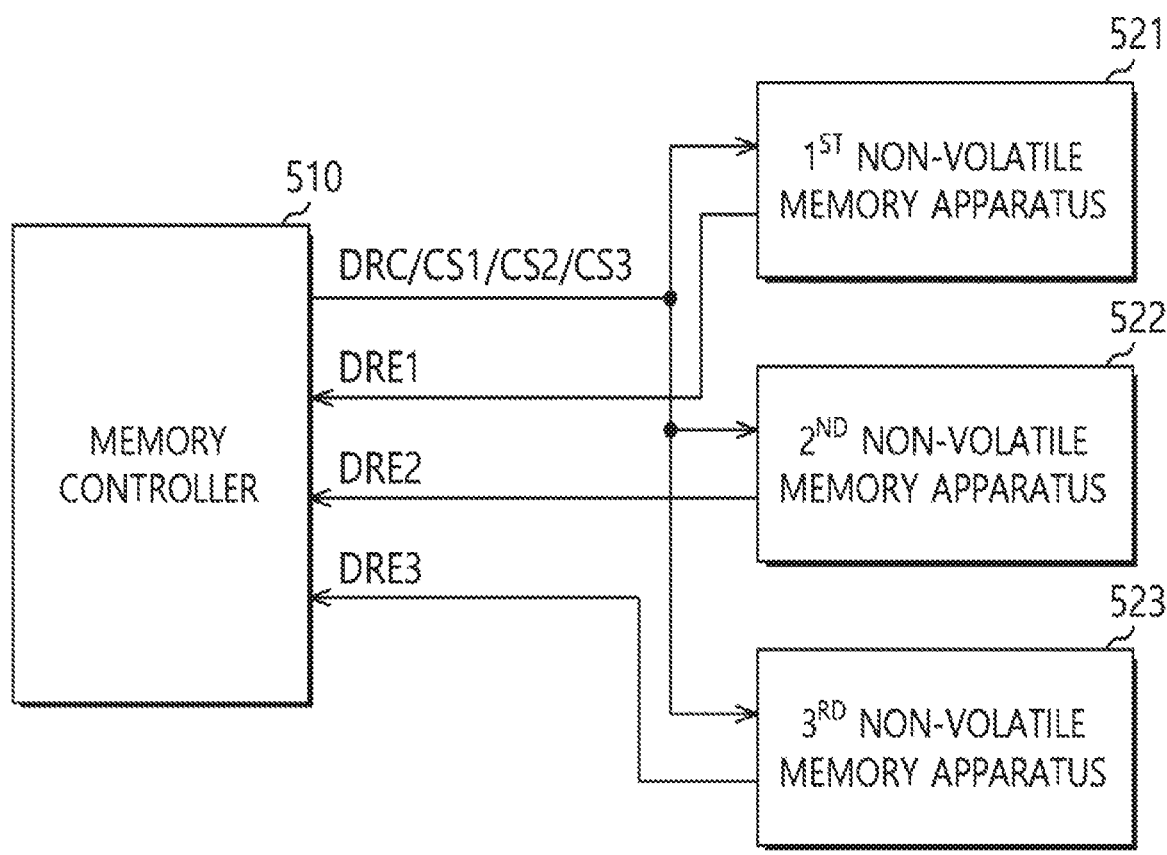
FIG. 5 is a diagram illustrating a configuration of a semiconductor system in accordance with an embodiment of the present disclosure.

FIG. 5 is a diagram illustrating a configuration of a semiconductor system 5 in accordance with an embodiment of the present disclosure. Referring to FIG. 5, the semiconductor system 5 may include a memory controller 510 and a plurality of non-volatile memory apparatuses 521, 522, and 523. Each of the plurality of non-volatile memory apparatuses 521, 522, and 523 may be a PRAM having memory cells each comprising a phase change substance. The memory controller 510 may control each of the plurality of non-volatile memory apparatuses 521, 522, and 523 to perform various operations. Although FIG. 5 exemplifies the semiconductor system 5 including first to third non-volatile memory apparatuses 521, 522, and 523, the number of non-volatile memory apparatuses 521, 522, and 523 will not be limited thereto. The semiconductor system 5 may be a subsystem within a computer system, a storage apparatus for storing big data or a storage-class memory. The first semiconductor apparatus 110 illustrated in FIG. 1 may be applied as the memory controller 510 and the second semiconductor apparatus 120 illustrated in FIG. 1 may be applied as one among the first to third non-volatile memory apparatuses 521, 522, and 523.

The memory controller 510 may measure each power off time tOFF of the first to third non-volatile memory apparatuses 521, 522, and 523 and may provide the recovery command signal DRC to each of the first to third non-volatile memory apparatuses 521, 522, and 523 based on the measured power off time tOFF. The memory controller 510 may provide the recovery command signal DRC to the first to third non-volatile memory apparatuses 521, 522, and 523 when the first to third non-volatile memory apparatuses 521, 522, and 523 are powered up. The memory controller 510 may detect the threshold voltage change in each of the first to third non-volatile memory apparatuses 521, 522, and 523 and may generate the recovery command signal DRC for one or more of the first to third non-volatile memory apparatuses 521, 522, and 523 to perform the drift recovery operations. The memory controller 510 may provide a first chip selection signal CS1, a second chip selection signal CS2 and a third chip selection signal CS3 along with the recovery command signal DRC. The first non-volatile memory apparatus 521 may perform the drift recovery operation based on the recovery command signal DRC when the first chip selection signal CS1 is enabled. The second non-volatile memory apparatus 522 may perform the drift recovery operation based on the recovery command signal DRC when the second chip selection signal CS2 is enabled. The third non-volatile memory apparatus 523 may perform the drift recovery operation based on the recovery command signal DRC when the third chip selection signal CS3 is enabled.

The memory controller 510 may selectively enable the chip selection signal CS relating to the non-volatile memory apparatus to perform the drift recovery operation according to the threshold voltage change. For example, when the first and third non-volatile memory apparatuses 521 and 523 are to perform the drift recovery operations, the memory controller 510 may enable the first and third chip selection signals CS1 and CS3 along with the recovery command signal DRC. Therefore, the first and third non-volatile memory apparatuses 521 and 523 may perform the drift recovery operations based on the recovery command signal DRC while the second non-volatile memory apparatus 522 does not perform the drift recovery operation. The memory controller 510 may provide the second non-volatile memory apparatus 522 with the normal command signal, and the second non-volatile memory apparatus 522 may perform the normal operation while the first and third non-volatile memory apparatuses 521 and 523 perform the drift recovery operations.

The first to third non-volatile memory apparatuses 521, 522, and 523 may perform the drift recovery operations based on the recovery command signal DRC and may transmit, upon completion of the recovery operations, the recovery completion signals DRE1, DRE2 and DRE3 to the memory controller 510. Based on the recovery completion signals DRE1, DRE2 and DRE3, the memory controller 510 may provide the normal command signal to one or more non-volatile memory apparatuses that complete the recovery operations among the first to third non-volatile memory apparatuses 521, 522, and 523 to perform the normal operations. For example, the first and third non-volatile memory apparatuses 521 and 523 are performing the recovery operations and the second non-volatile memory apparatus 522 provides the recovery completion signal DRE2 to the memory controller 510, the memory controller 510 may provide the normal command signal to the second non-volatile memory apparatus 522. While the first and third non-volatile memory apparatuses 521 and 523 are performing the recovery operations, the second non-volatile memory apparatus 522 may perform the normal operation.

Figure 6:
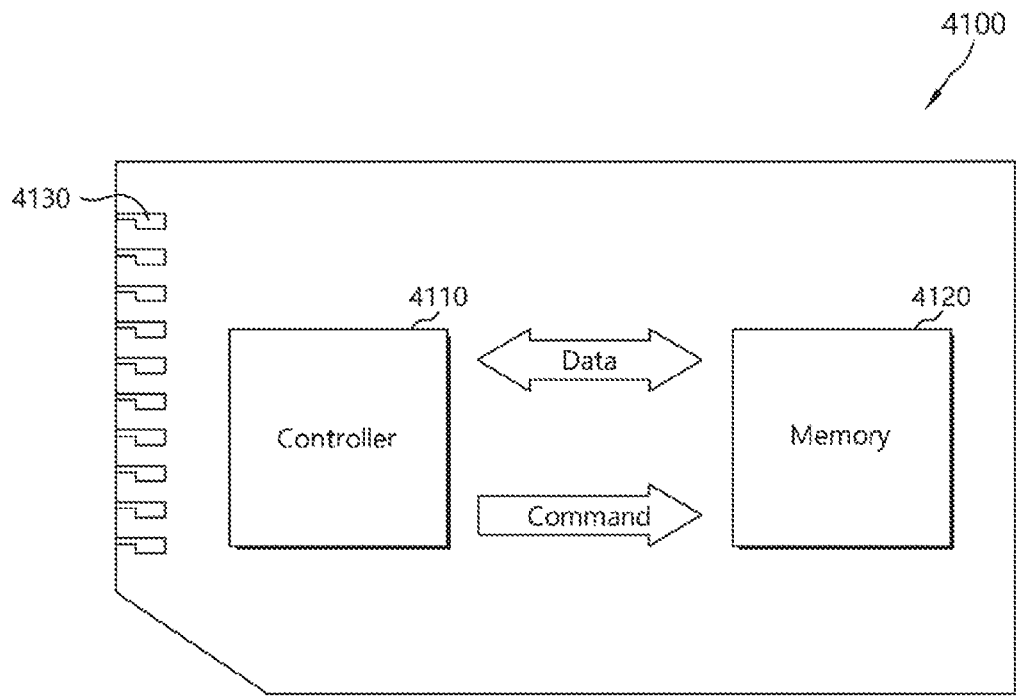
FIG. 6 shows a diagram illustrating a memory card including the semiconductor memory apparatus in accordance with an embodiment.

FIG. 6 shows a diagram illustrating a memory card including the semiconductor memory apparatus in accordance with some embodiments. Referring to FIG. 6, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior. The controller 4110 may include the first semiconductor apparatus 110 and the memory controller 510 according to the above-described embodiments. The memory 4120 may include the second semiconductor apparatus 120 and at least one of the non-volatile memory apparatuses 521, 522, and 523 according to the above-described embodiments.

The interface members 4130 may control the input/output of data from/to the exterior. The memory card system 4100 may be a multimedia card (MMC), a secure digital card (SD), or a portable data storage device.

Figure 7:
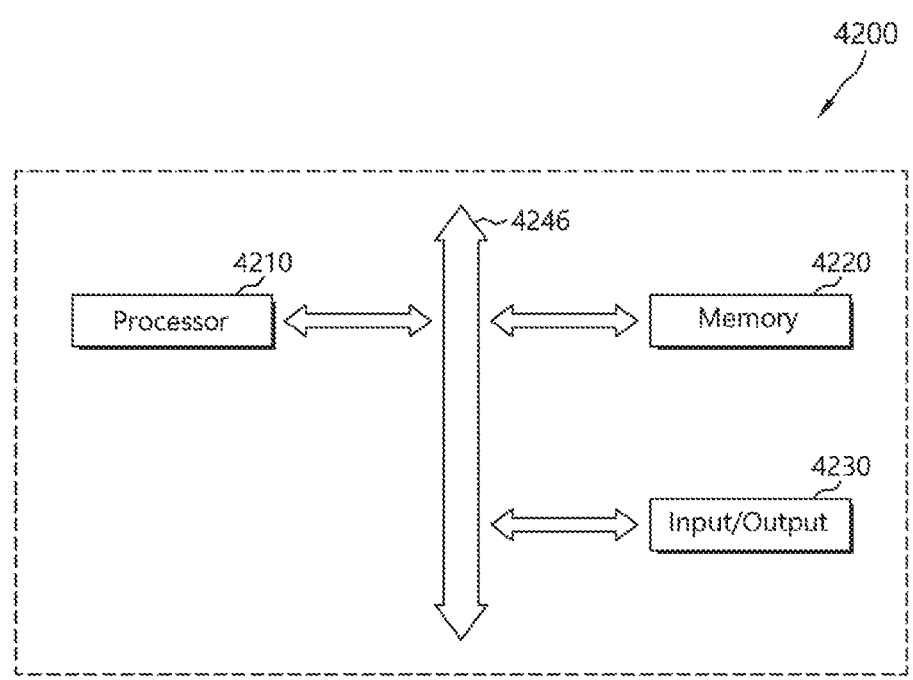
FIG. 7 shows a block diagram to assist in the explanation of an electronic apparatus including a semiconductor memory apparatus in accordance with an embodiment.

FIG. 7 shows a block diagram to assist in the explanation of an electronic apparatus including the semiconductor memory apparatus in accordance with some embodiments. Referring to FIG. 7, the electronic apparatus 4200 may include a processor 4210, a memory 4220, and an input/output device 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The processor 4210 may include the first semiconductor apparatus 110 and the memory controller 510 according to the above-described embodiments. The memory 4220 may include the second semiconductor apparatus 120 and at least one of the non-volatiles memory apparatuses 521, 522, and 523 according to the above-described embodiments. In order for detailed realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions appear below for the detailed realization and modified examples of the electronic apparatus 4200, with reference to FIGS. 8 and 9.

Figure 8:
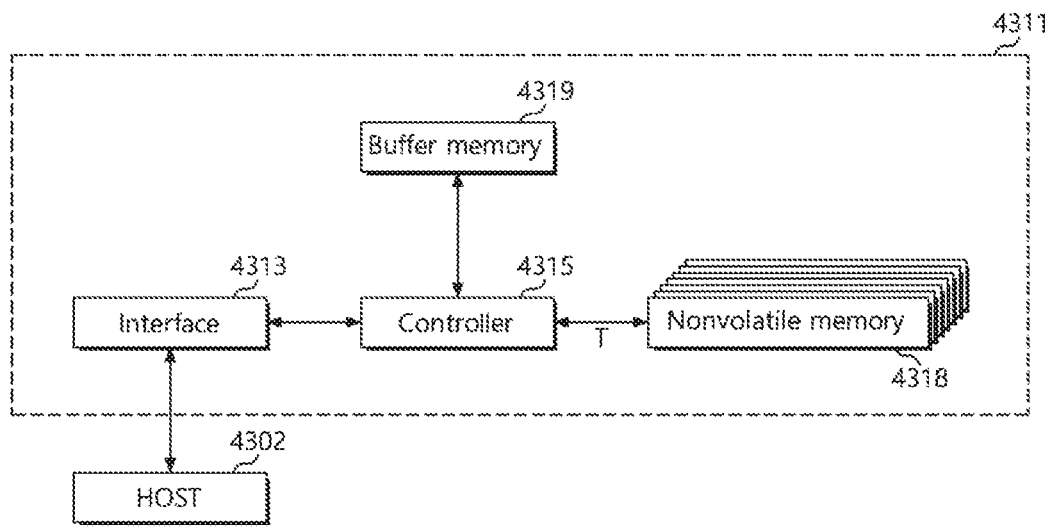
FIG. 8 shows a block diagram illustrating a data storage device including a semiconductor memory apparatus in accordance with an embodiment.

FIG. 8 shows a block diagram illustrating a data storage device including the semiconductor memory apparatus in accordance with some embodiments. Referring to FIG. 8, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that speed is high, additionally, a mechanical delay, a failure rate, heat generation, and noise generation decrease, and miniaturization, and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and be electrically coupled to the controller 4315. The controller 4315 may include the first semiconductor apparatus 110 and the memory controller 510 according to the above-described embodiments. Each of the nonvolatile memories 4220 may include the second semiconductor apparatus 120 and at least one of the non-volatiles memory apparatuses 521, 522, and 523 according to the above-described embodiments.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the second semiconductor apparatus 120 and at least one of the non-volatiles memory apparatuses 521, 522, and 523 according to the above-described embodiments.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

Figure 9:
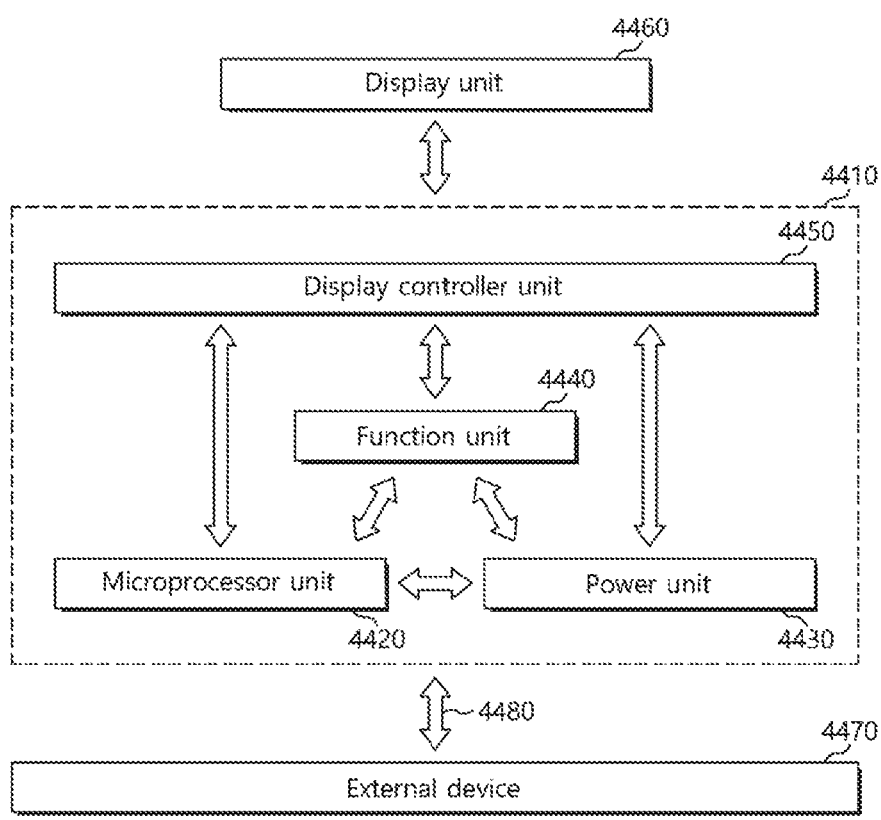
FIG. 9 shows a block diagram illustrating an electronic system including a semiconductor memory apparatus in accordance with an embodiment.

FIG. 9 shows a block diagram illustrating an electronic system including the semiconductor memory apparatus in accordance with some embodiments. Referring to FIG. 9, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may play the role of receiving a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or wireless communication unit 4480. In the case where the electronic system 4400 needs a USB or the like to expand functionality, the function unit 4440 may play the role of an interface controller. The semiconductor memory apparatus in accordance with the above-described embodiments may be applied as at least any one of the microprocessor unit 4420 and the function unit 4440.

While certain embodiments have been described above, it will be understood to those skilled in the art that the embodiments described are by way of example only. Accordingly, the nonvolatile memory apparatus, semiconductor system including the same, and operating method thereof should not be limited based on the described embodiments. Rather, the nonvolatile memory apparatus, semiconductor system including the same, and operating method thereof described herein should only be limited in light of the claims that follow when taken in conjunction with the above description and accompanying drawings.

What is claimed is:

1. A semiconductor system comprising: a non-volatile memory apparatus configured to perform a drift recovery operation based on a recovery command signal; and
a memory controller configured to measure a power off time of the non-volatile memory apparatus and generate the recovery command signal based on the power off time,
wherein the drift recovery operation restores a resistance of a memory cell of the non-volatile memory apparatus to an original resistance value; and
wherein the power off time is a duration during which the non-volatile memory apparatus is powered-down.

2. The semiconductor system of claim 1, wherein the memory controller is configured to generate the recovery command signal when the power off time is equal to or longer than a threshold time period.

3. The semiconductor system of claim 1, wherein the non-volatile memory apparatus performs a first drift recovery operation of applying a recovery voltage across a memory cell, based on the recovery command signal.

4. The semiconductor system of claim 3, wherein the recovery voltage has a voltage level high enough to cause a snap-back of a memory cell in a low resistance state and a high resistance state.

5. The semiconductor system of claim 1, wherein the non-volatile memory apparatus performs, based on the recovery command signal, a second recovery operation of applying a drift read voltage across a memory cell, performing a set write operation to a memory cell determined to be in a low resistance state and performing a reset write operation to a memory cell determined to be in a high resistance state.

6. The semiconductor system of claim 5, wherein the drift read voltage has a voltage level for distinguishing between a drifted low resistance state and a drifted high resistance state.

7. The semiconductor system of claim 6, wherein the drift read voltage has a voltage level dynamically changing according to a degree of a resistance drift.

8. The semiconductor system of claim 1, wherein the non-volatile memory apparatus transmits a recovery completion signal to the memory controller when the drift recovery operation is completed.

9. The semiconductor system of claim 8, wherein the memory controller transmits a normal command signal to the non-volatile memory apparatus after receiving the recovery completion signal from the non-volatile memory apparatus.

10. A semiconductor system comprising: a non-volatile memory apparatus configured to perform a drift recovery operation based on a recovery command signal; and
a memory controller configured to calculate a threshold voltage change based on a power off time of the non-volatile memory apparatus and temperature change of the semiconductor system, and generate the recovery command signal based on the threshold voltage change,
wherein the drift recovery operation restores a resistance of a memory cell of the non-volatile memory apparatus to an original resistance value; and
wherein the power off time is a duration during which the non-volatile memory apparatus is powered-down.

11. The semiconductor system of claim 10, wherein the memory controller is configured to generate the recovery command signal when the combination of the power off time and the temperature change results in the threshold voltage change being greater than a threshold value based on a table.

12. The semiconductor system of claim 10, wherein the non-volatile memory apparatus performs a first drift recovery operation of applying a recovery voltage across a memory cell, based on the recovery command signal.

13. The semiconductor system of claim 12, wherein the recovery voltage has a voltage level high enough to cause a snap-back of a memory cell in a low resistance state and a high resistance state.

14. The semiconductor system of claim 10, wherein the non-volatile memory apparatus performs, based on the recovery command signal, a second recovery operation of applying a drift read voltage across a memory cell, performing a set write operation to a memory cell determined to be in a low resistance state and performing a reset write operation to a memory cell determined to be in a high resistance state.

15. The semiconductor system of claim 14, wherein the drift read voltage has a voltage level for distinguishing between a drifted low resistance state and a drifted high resistance state.

16. The semiconductor system of claim 14, wherein the drift read voltage has a voltage level dynamically changing based on the threshold voltage change.

17. The semiconductor system of claim 10, wherein the non-volatile memory apparatus transmits a recovery completion signal to the memory controller when the drift recovery operation is completed.

18. The semiconductor system of claim 17, wherein the memory controller transmits a normal command signal to the non-volatile memory apparatus after receiving the recovery completion signal from the non-volatile memory apparatus.

19. A method of operating a semiconductor system, the method comprising:
measuring, by a memory controller, a power off time of a non-volatile memory apparatus when the non-volatile memory apparatus is powered down, wherein the power off time is a duration during which the non-volatile memory apparatus is powered-down;
calculating, by the memory controller, a threshold voltage change based on the power off time;
determining, by the memory controller, whether a drift recovery is required, based on the threshold voltage change, wherein the drift recovery operation restoring a resistance of a memory cell of the non-volatile memory apparatus to an original resistance value; and
transmitting, by the memory controller, a recovery command signal and a normal command signal based on a result of the determining when the non-volatile memory apparatus is powered up.

20. The method of claim 19, wherein the determining includes comparing the threshold voltage change with a threshold value, to determine if the threshold voltage has reached or surpassed the threshold value.

21. The method of claim 19, wherein the determining includes enabling a recovery flag when the threshold voltage change is greater than a threshold value, and
wherein the transmitting of the recovery command signal and the normal command signal includes transmitting, by the memory controller, the recovery command signal to the non-volatile memory apparatus based on the recovery flag when the non-volatile memory apparatus is powered up.

22. The method of claim 19, further comprising performing, by the non-volatile memory apparatus, a drift recovery operation based on the recovery command signal.

23. The method of claim 22, further comprising transmitting, by the non-volatile memory apparatus, a recovery completion signal to the memory controller upon completion of the drift recovery operation.

24. The method of claim 23, wherein the transmitting of the recovery command signal and the normal command signal includes transmitting, by the memory controller, the normal command signal to the non-volatile memory apparatus after receiving the recovery completion signal from the non-volatile memory apparatus.

25. The method of claim 22, wherein the drift recovery operation includes at least one of a first recovery operation and a second recovery operation.

* * * * *